United States Patent
Chen et al.

(10) Patent No.: US 10,325,931 B2
(45) Date of Patent: Jun. 18, 2019

(54) DISPLAY DEVICE

(71) Applicant: INNOLUX CORPORATION, Jhu-Nan, Miao-Li County (TW)

(72) Inventors: Cheng-Hsiung Chen, Jhu-Nan (TW); Pei-Chieh Chen, Jhu-Nan (TW); Chao-Hsiang Wang, Jhu-Nan (TW); Yi-Ching Chen, Jhu-Nan (TW)

(73) Assignee: INNOLUX CORPORATION, Jhu-Nan (TW)

( * ) Notice: Subject to any disclaimer, the term of this patent is extended or adjusted under 35 U.S.C. 154(b) by 183 days.

(21) Appl. No.: 15/139,198

(22) Filed: Apr. 26, 2016

(65) Prior Publication Data

US 2016/0322389 A1 Nov. 3, 2016

(30) Foreign Application Priority Data

Apr. 30, 2015 (TW) .............................. 104113794 A

(51) Int. Cl.
*H01L 27/12* (2006.01)
*G02F 1/1362* (2006.01)
*H01L 29/786* (2006.01)

(52) U.S. Cl.
CPC ...... *H01L 27/124* (2013.01); *G02F 1/136286* (2013.01); *H01L 29/7869* (2013.01); *G02F 1/136227* (2013.01)

(58) Field of Classification Search
CPC ......... G02F 1/136227; G02F 1/136286; H01L 27/124
See application file for complete search history.

(56) References Cited

U.S. PATENT DOCUMENTS

| | | | | |
|---|---|---|---|---|
| 2004/0095519 A1* | 5/2004 | Kim | ....................... | G02F 1/1368 349/43 |
| 2004/0257489 A1* | 12/2004 | Gotoh | ............... | G02F 1/136209 349/44 |
| 2012/0162055 A1* | 6/2012 | Hara | ....................... | G02F 1/1362 345/92 |
| 2014/0346496 A1* | 11/2014 | Ro | ....................... | H01L 27/1248 257/43 |
| 2015/0277201 A1* | 10/2015 | Kong | ................ | G02F 1/136227 349/46 |

FOREIGN PATENT DOCUMENTS

| | | |
|---|---|---|
| TW | 536829 | 6/2003 |
| TW | 200703660 | 1/2007 |
| TW | 200721496 | 6/2007 |
| TW | M393041 | 11/2010 |

* cited by examiner

*Primary Examiner* — Jessica M Merlin
(74) *Attorney, Agent, or Firm* — Liu & Liu

(57) ABSTRACT

In a display device, a substrate has a pixel structure which has a first conductive layer, a second conductive layer and an oxide semiconductor layer. A trace portion of the first conductive layer extends along a first direction and has first and second opposite sides. The second conductive layer is disposed on the first conductive layer and has two contact portions respectively disposed on the first and second sides. The oxide semiconductor layer is disposed between the first conductive layer and the second conductive layer. Two ends of the oxide semiconductor layer contact the two contact portions respectively and the oxide semiconductor layer has a first width along the first direction, one of the contact portion and the first conductive layer have an overlap region which has a second width as maximum along the first direction, and the first width is narrower than the second width.

7 Claims, 9 Drawing Sheets

DISPLAY DEVICE

CROSS REFERENCE TO RELATED APPLICATIONS

This Non-provisional application claims priority under 35 U.S.C. § 119(a) on Patent Application No(s). 104113794 filed in Taiwan, Republic of China on Apr. 30, 2015, the entire contents of which are hereby incorporated by reference.

BACKGROUND

Technical Field

The invention relates to a flat display device.

Related Art

With the progress of technologies, flat display devices have been widely applied to various kinds of fields. Because of advantages such as compact structure, low power consumption, less weight and less radiation, they gradually take the place of cathode ray tube (CRT) display devices, and are widely applied to various electronic products, such as mobile phones, portable multimedia devices, notebooks, LCD TVs and LCD screens.

A conventional liquid crystal display (LCD) panel mainly includes a thin film transistor (TFT) substrate, a color filter (CF) substrate and a liquid crystal layer. The TFT substrate and the CF substrate are disposed oppositely, and the liquid crystal layer is sandwiched between the TFT substrate and the CF substrate. Herein, the TFT substrate has a plurality of pixels disposed on a substrate, and the liquid crystal molecules of the liquid crystal layer are controlled in those pixels respectively so that the display panel displays an image.

Because this market is very competitive, each enterprise determines to enhance high resolution and display quality of the display device. Therefore, it is an important subject to provide a display device which has smaller size of the pixel structure for high resolution product and has high display quality.

SUMMARY

An objective of one embodiment of the invention is to provide a display device which has smaller size of the pixel structure for high resolution product and has high display quality.

A display device according to one embodiment includes a substrate, an opposite substrate and a display medium layer. The substrate has a pixel structure. The pixel structure comprises a first conductive layer, a second conductive layer and an oxide semiconductor layer. The first conductive layer has a trace portion extending along a first direction. The trace portion has a first side and a second side opposite the first side. The second conductive layer is disposed on the first conductive layer and has two contact portions respectively disposed on the first side and the second side. The oxide semiconductor layer is disposed between the first conductive layer and the second conductive layer. Two ends of the oxide semiconductor layer contact the two contact portions respectively and the oxide semiconductor layer has a first width along the first direction, one of the contact portion and the first conductive layer have an overlap region, the overlap region has a second width as maximum along the first direction, and the first width is narrower than the second width. The display medium layer is disposed between the substrate and the opposite substrate.

In one embodiment, the first conductive layer further includes a protrusive portion extending from the second side of the trace portion to protrude.

In one embodiment, one of the contact portions overlaps the trace portion, and the other one of the contact portions overlaps the protrusive portion.

In one embodiment, the oxide semiconductor layer comprises two end portions and a connection portion located between the two end portions, the width of the connection portion along the first direction is narrower than the width of one of the end portions along the first direction.

In one embodiment, the two end portions overlap the two contact portions respectively.

In one embodiment, the pixel structure further includes a first insulating layer disposed between the oxide semiconductor layer and the second conductive layer, the first insulating layer has two openings corresponding to the contact portions, and the contact portions contact the oxide semiconductor layer through the openings.

In one embodiment, one of the openings exposes one terminal edge of the oxide semiconductor layer.

In one embodiment, the first insulating layer covers the other terminal edge of the oxide semiconductor layer.

In one embodiment, the pixel structure further includes a second insulating layer and an electrode, the second insulating layer is disposed on the second conductive layer, the electrode is disposed on the second insulating layer, and the electrode is connected to one of the contact portions through a through hole of the second insulating layer.

In one embodiment, the pixel structure further includes a shading bar disposed near the first side of the first conductive layer, and the through hole is correspondingly located between the shading bar and the trace portion.

In one embodiment, the second conductive layer further includes a wiring portion extending along a second direction, the wiring portion is connected to the other one of the contact portions, and the first direction is cross to the second direction.

As mentioned above, as to the display device, the second conductive layer of the pixel structure includes two contact portions which are respectively and correspondingly disposed on the first side and the second side of the trace portion of the first conductive layer, the oxide semiconductor layer is disposed between the first conductive layer and the second conductive layer and the two ends of the oxide semiconductor layer respectively contact the two contact portions. Moreover, the first width of the oxide semiconductor layer along the first direction is narrower than the maximum width (the second width) of the overlap region of one of the contact portions and the first conductive layer along the first direction. Therefore, the size of the pixel structure is smaller and suitable for high resolution product, and the electrical performance of the pixel structure will be better and the display device will have higher display quality.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

The embodiments of the invention will be apparent from the following detailed description, which proceeds with reference to the accompanying drawings, wherein the same references relate to the same elements.

Figure 1A:
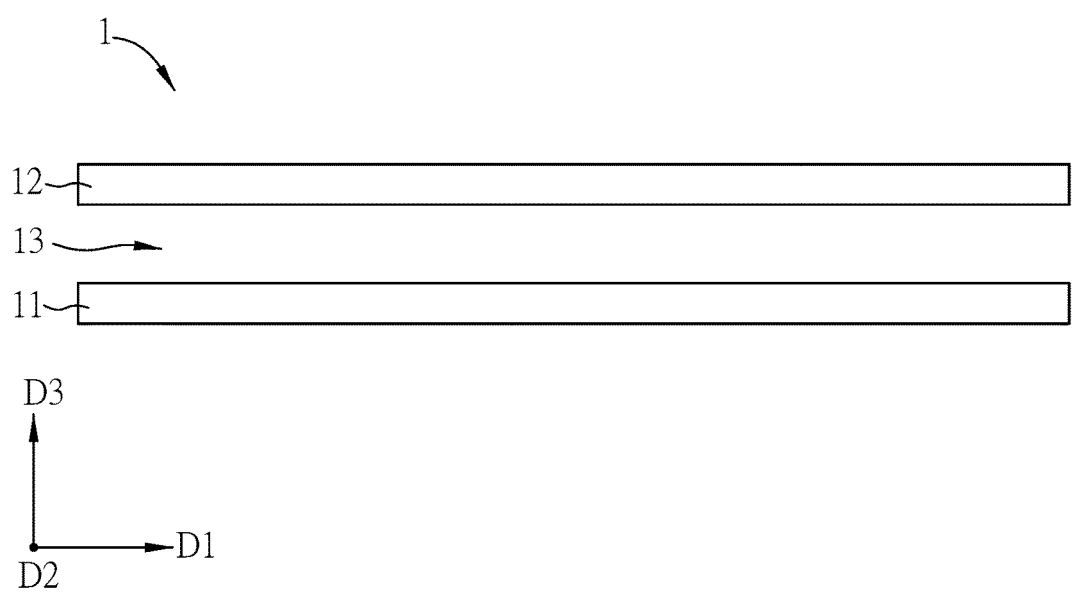
FIG. 1A is a schematic diagram showing a display device according to the embodiment.
Figure 1B:
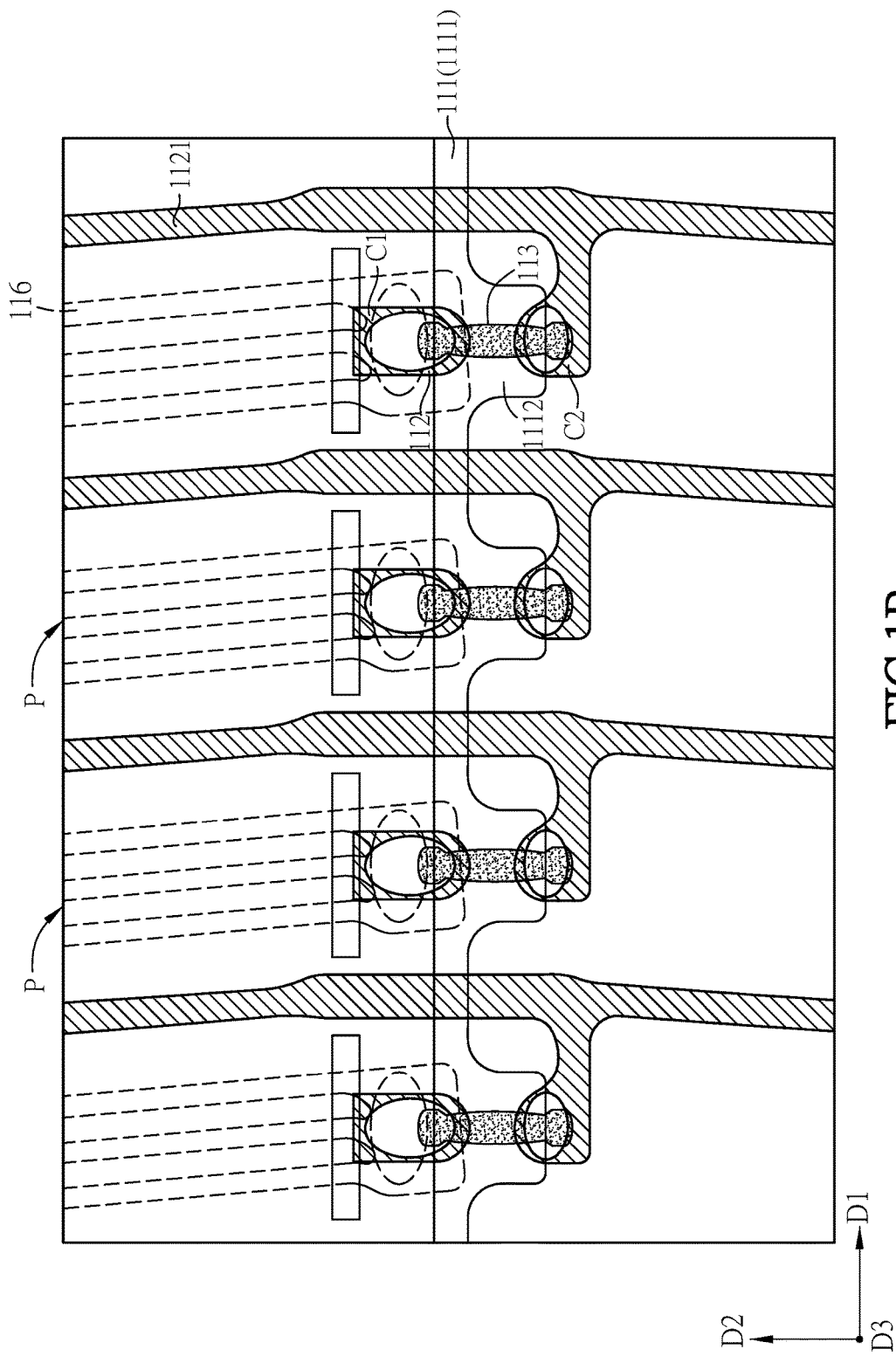
FIG. 1B is a schematic diagram showing a plurality of pixel structures in the display device in FIG. 1A.
Figure 1C:
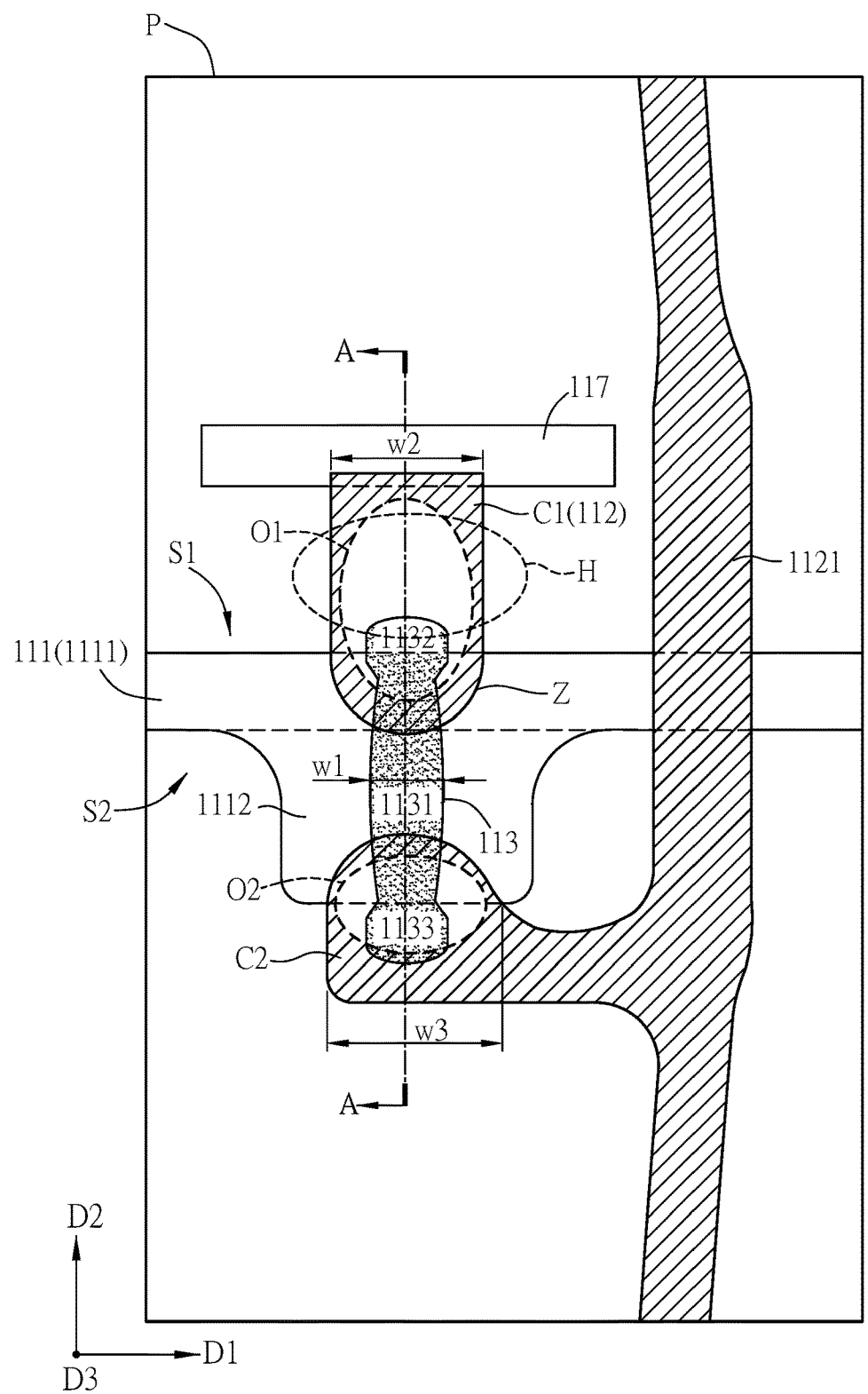
FIG. 1C is an enlarged schematic diagram showing one pixel structure in FIG. 1B.
Figure 1D:
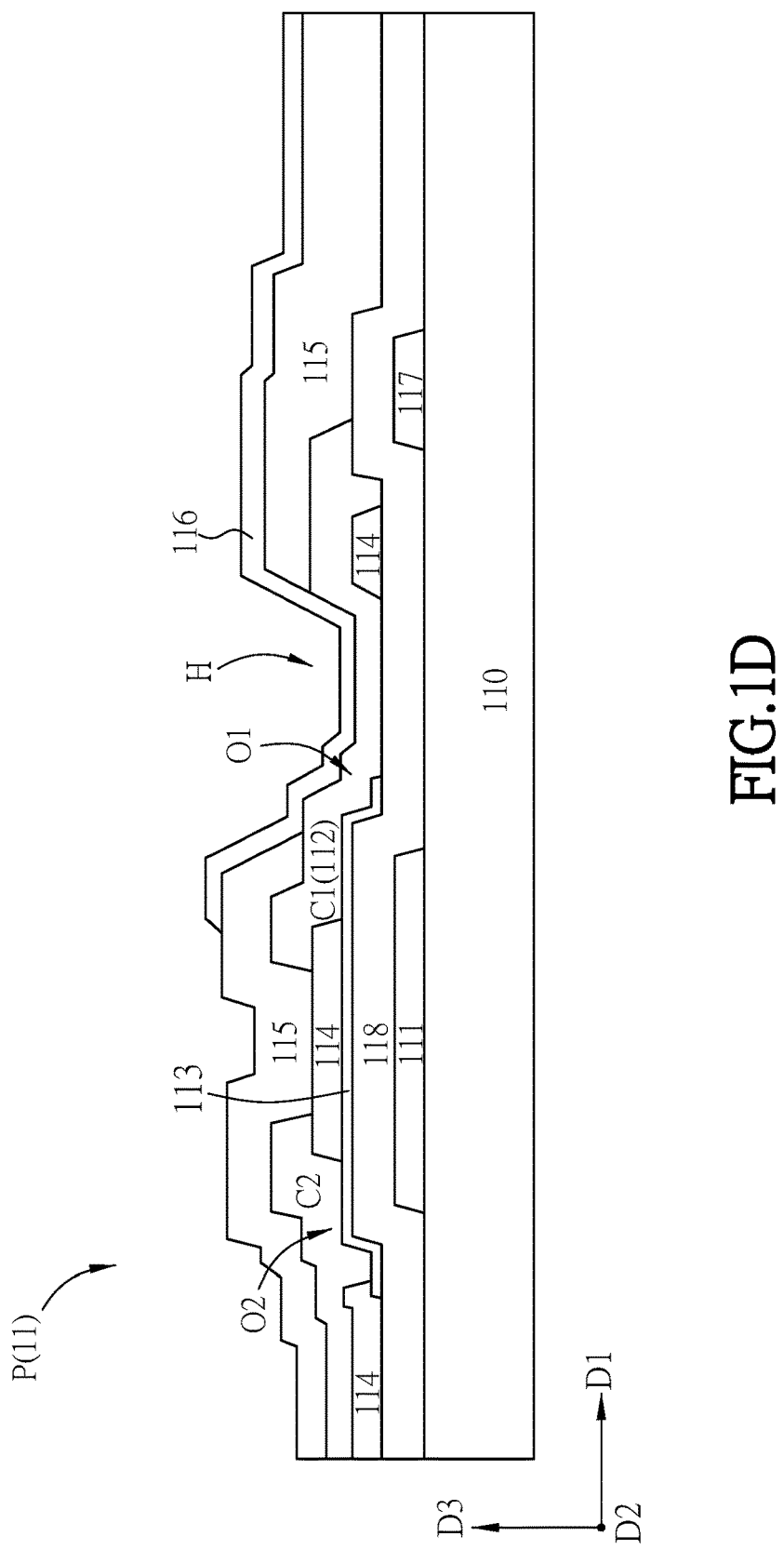
FIG. 1D is a schematic sectional diagram along line A-A in FIG. 1C.

Referring to FIG. 1A to FIG. 1D, FIG. 1A is a schematic diagram showing a display device 1 according to one embodiment, FIG. 1B is a schematic diagram showing a plurality of pixel structures P in the display device 1 in FIG. 1A, FIG. 1C is an enlarged schematic diagram showing one pixel structure in FIG. 1B, and FIG. 1D is a schematic sectional diagram along line A-A in FIG. 1C. The figures show a first direction D1, a second direction D2 and a third direction D3. Any two of the first direction D1, the second direction D2 and the third direction D3 are substantially perpendicular to each other. The first direction D1 can be substantially parallel to the extended direction of the scan lines. The second direction D2 can be substantially parallel to the extended direction of the data lines. The third direction D3 is another direction which is substantially perpendicular to the first direction D1 and the second direction D2.

Referring to FIG. 1A, the display device 1 includes a substrate 11, an opposite substrate 12 and a display medium layer 13.

The substrate 11 is disposed opposite the opposite substrate 12, and the display medium layer 13 is sandwiched between the substrate 11 and the opposite substrate 12. The substrate 11 and the opposite substrate 12 can respectively include transparent material, for example a glass substrate, a quartz substrate or a plastic substrate and it is not limited thereto. In the embodiment, the display device 1 can be an LCD (liquid crystal display) panel or an OLED (organic light-emitting diode) display panel. Here, taking the LCD panel for example, the display medium layer 13 is a liquid crystal layer. The substrate 11 can be a TFT (thin film transistor) substrate and the opposite substrate 12 can be a CF (color filter) substrate. The substrate 11, the display medium layer 13 and the opposite substrate 12 form an LCD panel. In other embodiments, when the display device 1 is an OLED display panel, the display medium layer 13 can be an OLED layer. In one embodiment, when the OLED layer emits white light, the opposite substrate 12 can be a CF substrate. In other embodiments, when the OLED layer emits color light for example red, green or blue light, the opposite substrate 12 can be a cover plate to protect the OLED layer from environment mist or pollution of foreign object.

Referring to FIG. 1B to FIG. 1D, the substrate 11 has a substrate 110 (not shown in FIG. 1B and FIG. 1C) and at least one the pixel structure P. The pixel structure P is disposed on the substrate 110. In the embodiment, there are a plurality of the pixel structures P. The pixel structures P can be arranged in a two dimension array. One of the pixel structure P includes a first conductive layer 111, a second conductive layer 112 and an oxide semiconductor layer 113. The first conductive layer 111, the second conductive layer 112 and the oxide semiconductor layer 113 can form a TFT which acts as a switch element of the pixel. Besides, referring to FIG. 1D, the pixel structure P in the embodiment can further include a first insulating layer 114, a second insulating layer 115, an electrode 116, a shading bar 117 and a dielectric layer 118. For the sake of clarity, the electrode 116 in FIG. 1B is illustrated with dashed line, the FIG. 1C only shows the first conductive layer 111, the second conductive layer 112, the oxide semiconductor layer 113 and a shading bar 117 of the pixel structure P, and other film layers are not shown.

Referring to FIG. 1C and FIG. 1D, the first conductive layer 111 is disposed on the substrate 110 of the substrate 11, and the first conductive layer 111 includes a trace portion 1111 extending along the first direction D1. The trace portion 1111 has a first side S1 and a second side S2 opposite the first side S1. In the embodiment, the first side S1 is the upper side of the trace portion 1111 of the first conductive layer 111 in FIG. 1C. The second side S2 is the other side which is opposite to the first side S1 (the below side of the trace portion 1111). The material of the first conductive layer 111 can be metal (e.g. aluminum, copper, silver, molybdenum, or titanium) or single-layer structure or multi-layer structure formed by their alloy. The first conductive layer 111 can form a gate (not labeled) of the TFT and the scan line for pixel.

The dielectric layer 118 is disposed on the first conductive layer 111 and the substrate 110. The material of the dielectric layer 118 can be organic material (e.g. organic silicon oxide compounds), or inorganic materials (e.g. silicon nitride, silicon oxide, nitrogen silicon oxide, silicon carbide, alumina, hafnium oxide or multi-layer structure of the above materials). In the embodiment, the dielectric layer 118 covers the gate and the shading bar 117, and the dielectric layer 118 may partially or fully cover the substrate 110.

The second conductive layer 112 is disposed on the first conductive layer 111 and has two contact portions. The contact portions are respectively and correspondingly disposed on the first side S1 and the second side S2. In the embodiment, the contact portion which corresponds to the first side S1 is labeled the first contact portion C1 (regarded as the drain of the TFT, not labeled), the contact portion which corresponds to the second side S2 is labeled the second contact portion C2 (regarded as the source of the TFT, not labeled). Besides, the second conductive layer 112 further includes a wiring portion 1121 extending along the second direction D2. The wiring portion 1121 is connected to the second contact portion C2. Here, the wiring portion 1121 can be the data line of pixel.

The oxide semiconductor layer 113 is disposed between the first conductive layer 111 and the second conductive layer 112. Two terminals of the oxide semiconductor layer 113 respectively contact the contact portions C1, C2. In the embodiment, the first contact portion C1 and the second contact portion C2 are disposed on the oxide semiconductor layer 113 and contact the two terminals of the oxide semiconductor layer 113. The oxide semiconductor layer 113 can be a channel layer of TFT, and includes for example but not limited to metal-oxide-semiconductor which may have one of indium, gallium, zinc and tin, for example indium gallium zinc oxide (IGZO).

Besides, referring to FIG. 1C, the first conductive layer 111 further includes a protrusive portion 1112 which extends from the trace portion 1111. In the embodiment, the protrusive portion 1112 extends from the second side S2 of the trace portion 1111 (the protrusive portion 1112 extends along a direction parallel to the second direction D2). The first contact portion C1 overlaps the trace portion 1111 in the third direction D3, and the second contact portion C2 overlaps the protrusive portion 1112 in the third direction D3.

An interval exists between the first contact portion C1 and the second contact portion C2. The interval means that the first contact portion C1 and the second contact portion C2 do not directly connect each other and space apart from each other. Besides, the first insulating layer 114 is disposed between the oxide semiconductor layer 113 and the second conductive layer 112. The first insulating layer 114 is disposed on the oxide semiconductor layer 113 (the channel layer) and has two openings O1, O2 corresponding to the first contact portion C1 and the second contact portion C2. The first contact portion C1 and the second contact portion C2 contact the oxide semiconductor layer 113 respectively through the openings O1, O2.

When the switch element of the pixel is off, the first contact portion C1 and the second contact portion C2 are electrically isolated from each other. The first insulating layer 114 can be organic material—organic silicon oxide compounds for example, or the first insulating layer 114 can be inorganic material—silicon nitride, silicon oxide, nitrogen silicon oxide, silicon carbide, alumina, hafnium oxide, or multi-layer structure of above materials, for example. In other embodiments, the first contact portion C1 and the second contact portion C2 may be directly contact the oxide semiconductor layer 113, and the first insulating layer 114 is eliminated.

In the embodiment, the first insulating layer 114 is an etch stop layer. The first contact portion C1 and the second contact portion C2 are respectively disposed over the openings O1, O2 of the first insulating layer 114, and the first contact portion C1 and the second contact portion C2 partially cover the first insulating layer 114 and contact the oxide semiconductor layer 113 respectively through the openings O1, O2 of the first insulating layer 114. Because the first contact portion C1 and the second contact portion C2 which are disposed in the openings O1, O2 only partially overlap the first conductive layer 111 (in other words, there are smaller overlap area between the first conductive layer 111 and the second conductive layer 112) in the third direction D3, the parasitic capacitance (for example Cgd, Cgs) of the TFT can be reduced, so as to improve electrical performance by lessening feedthrough effect of the pixel structure P and to better display quality. Moreover, in the embodiment, the shapes of the two openings O1, O2 are different, the shapes of the first contact portion C1 and the second contact portion C2, which are correspondingly disposed in the openings O1, O2, are also different. Therefore, the sizes of the openings O1, O2 can be utilized to adjust the contact area (adjusting contact resistance) of the first contact portion C1 and the oxide semiconductor layer 113 and to adjust the contact area of the second contact portion C2 and the oxide semiconductor layer 113, so as to reduce leak current of the TFT.

Besides, referring to FIG. 1C, in the embodiment, the oxide semiconductor layer 113 extends along the second direction D2, so the trace portion 1111 is substantially perpendicular the oxide semiconductor layer 113. The oxide semiconductor layer 113 has a middle portion 1131 and two end portions 1132, 1133 located at two sides of the middle portion 1131. The middle portion 1131 extends along the second direction D2. The width of the middle portion 1131 along the first direction D1 is narrower than the width of one of the end portions 1132, 1133 along the first direction D1. The two ends of the oxide semiconductor layer 113 are wider and the center of the oxide semiconductor layer 113 is narrower. Thus, the widths of two adjacent pixel structure P along the first direction D1 are decreased (namely, the distance between the data lines of the adjacent pixel structures P is decreased so the size of the pixel structure P becomes smaller) and this pixel structure can be applied to high resolution product. Moreover, the first contact portion C1, the second contact portion C2 and the oxide semiconductor layer 113 can have larger contact areas in the openings O1, O2 to lower the contact resistance.

Besides, referring to FIG. 1C and FIG. 1D, in the embodiment, one of the openings O1, O2 fully exposes one of the end portions (e.g. the end portion 1132) of the oxide semiconductor layer 113, and the first insulating layer 114 covers the other one of the end portions (e.g. the middle portion 1131) of the oxide semiconductor layer 113. In other words, the opening O1 (the drain side) exposes entirely the end portion 1132 of the oxide semiconductor layer 113 (FIG. 1D, the right side of the oxide semiconductor layer 113), and the end portion 1132 contacts the first contact portion C1. The opening O2 (the source side) partially exposes the end portion 1133 (FIG. 1D, the left side of the oxide semiconductor layer 113). The first insulating layer 114 covers the terminal part of the oxide semiconductor layer 113. Moreover, the oxide semiconductor layer 113 has a first width w1 along the first direction D1. An overlap region Z of the contact portion C1 (C2) and the first conductive layer 111 has a second width w2, the second width w2 indicates the maximum width of the overlap region Z along the first direction D1, and the first width w1 is narrower than the second width w2. In the embodiment, the first width w1 is, for example but not limited to, the maximum width of the middle portion 1131 of the oxide semiconductor layer 113 along the first direction D1, and the second width w2 is, for example but not limited to, the maximum width of the overlap region Z of the first contact portion C1 in the third direction D3, and the first width w1 is narrower than the second width w2. Further, in the embodiment, the maximum width of the overlap region of the second contact portion C2 and the first conductive layer 111 in the third direction D3 is a third width w3, and the first width w1 can be also narrower than the third width w3. Therefore, due to the design of the pixel structure P, the first contact portion C1, the second contact portion C2 and the oxide semiconductor layer 113 are guaranteed to have larger contact areas (contact resistance is lower) so that the TFT (the pixel structure P) has better electrical characteristic for better display quality.

Referring to FIG. 1D again, the second insulating layer 115 is disposed on and covers the second conductive layer 112, and the electrode 116 is disposed on the second insulating layer 115. The electrode 116 can be connected to one of the contact portions C1, C2 through a through hole H of the second insulating layer 115. The material of the second insulating layer 115 may be organic material for example but not limited to organic material. The material of the electrode 116 can be Indium tin oxide (ITO), Indium zinc oxide (IZO), Aluminum zinc oxide (AZO), Cadmium tin oxide (CTO), Tin oxide (SnO2), Zinc oxide (ZnO), or other transparent conductive material. In the embodiment, the electrode 116 is a pixel electrode.

In addition, the shading bar 117 is disposed near the first side S1 of the first conductive layer 111. The through hole H is correspondingly located between the shading bar 117 and the trace portion 1111. The shading bar 117 and the first conductive layer 111 can be the same layer and formed by etching process. The shading bar 117 can solve the light leakage at a sharp turn in the electrode 116 (the pixel electrode), and the light leakage results from the abnormal arranged of liquid crystal molecules.

When a plurality of scan lines of the substrate 111 receive a scan signal, the TFTs of the pixel structure P corresponding to the respective scan lines are accordingly turned on and a data signal corresponding to each column pixel is sent to the electrode 116 of the corresponding pixel structure P. A voltage bias is formed between the electrode 116 and a common electrode to drive the liquid crystal molecule, and thus the display panel 1 can display an image.

Figure 1E:
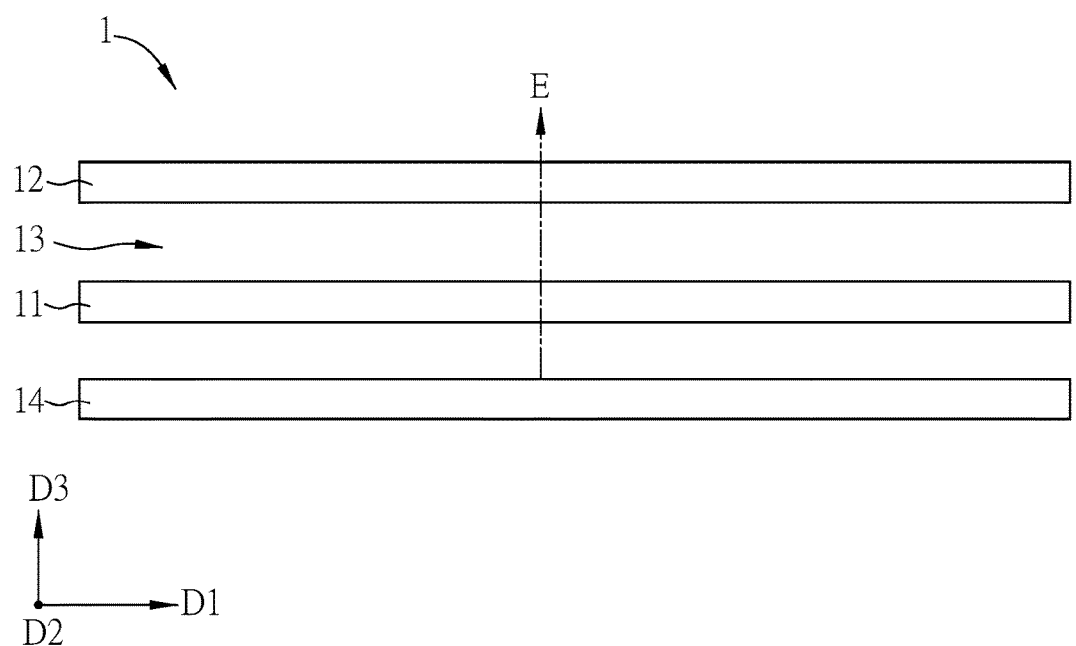
FIG. 1E is another schematic diagram showing the display device 1.

Moreover, referring to FIG. 1E, it is another schematic diagram showing the display device 1.

In the embodiment, the display device 1 further includes a backlight module 14. When the light beam E which is emitted from the backlight module 14 passes through the substrate 11, the display medium layer 13 and the opposite substrate 12 in sequence, the display panel can display color to form an image.

Figure 2:
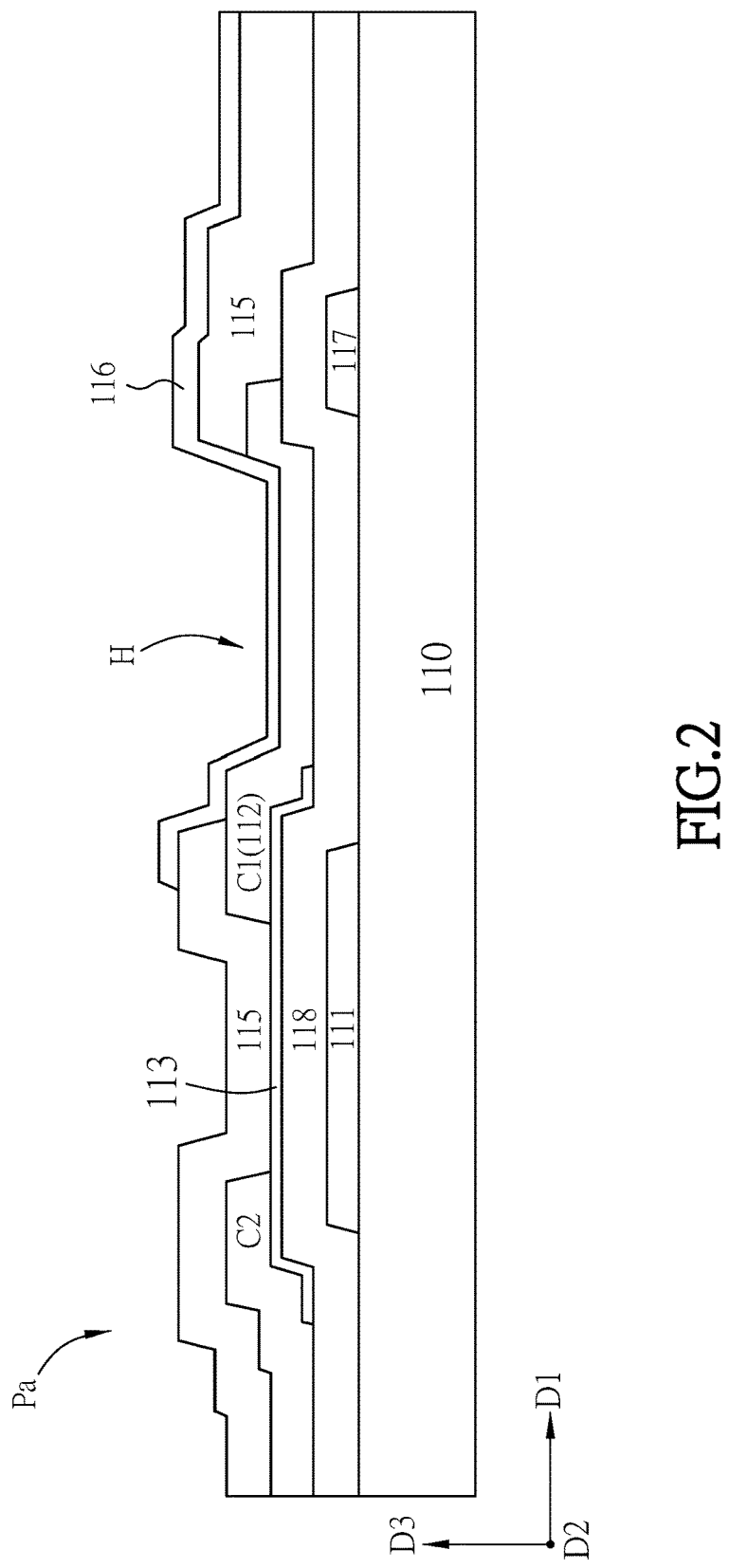
FIG. 2 is a schematic diagram showing the pixel structure according to another embodiment.

Moreover, referring to FIG. 2, it is a schematic diagram showing the pixel structure Pa according to another embodiment.

The difference between the pixel structure Pa in FIG. 2 and the pixel structure P in FIG. 1D is that the pixel structure Pa has no first insulating layer 114 disposed therein, so the first contact portion C1 and the second contact portion C2 of the second conductive layer 112 are directly disposed contact the oxide semiconductor layer 113.

Because other features of the pixel structure Pa are similar to the corresponding elements of the pixel structure P, the description about other features of the pixel structure Pa are omitted here.

Moreover, referring to FIG. 3A to FIG. 3E showing the pixel structure Pb-Pf according to various embodiments. FIG. 3A to FIG. 3E only show the first conductive layer 111, the second conductive layer 112 and the oxide semiconductor layer 113 of the pixel structure Pb~Pf, and other layers are not shown.

Figure 3A:
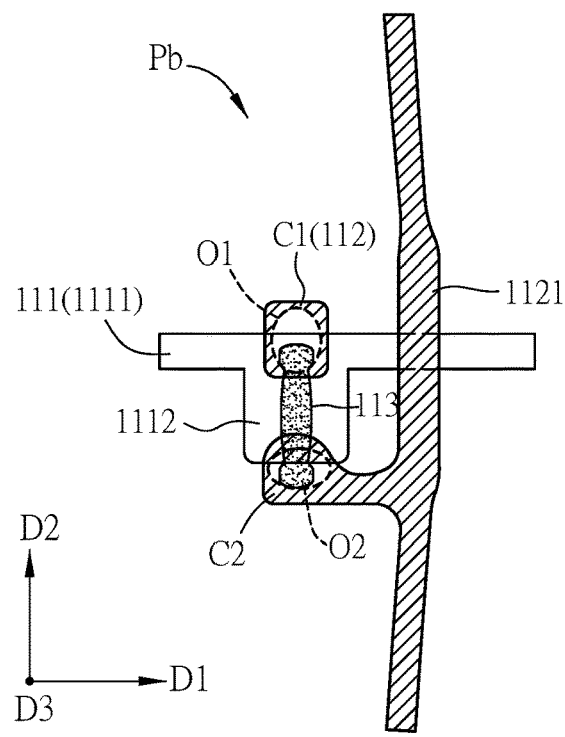
FIG. 3A to FIG. 3E are schematic diagrams showing the pixel structure according to various embodiments.

Referring to FIG. 3A, compared with the pixel structure P in FIG. 1D, an end portion (upper side) of the oxide semiconductor layer 113 is fully located in the projecting region of the first conductive layer 111 in the third direction D3.

Figure 3B:
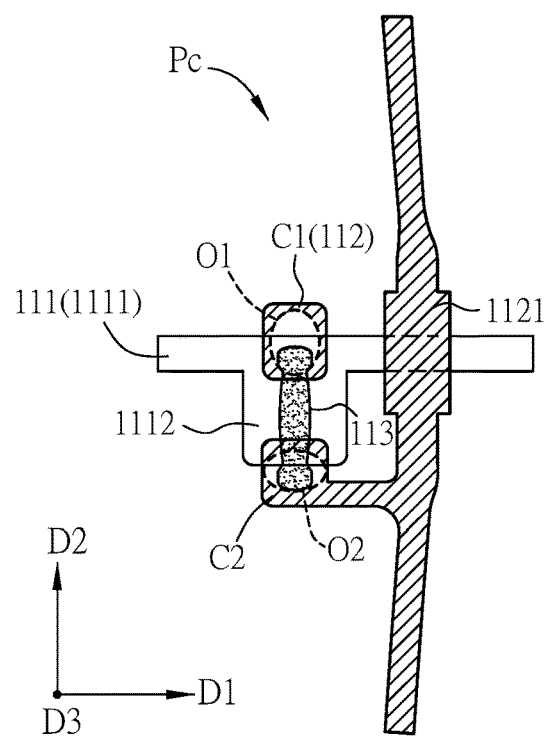

Referring to FIG. 3B, compared with the pixel structure Pb in FIG. 3A, when the pixel structure Pc is viewed along the third direction D3, the overlap region of the wiring portion 1121 and the first conductive layer 111 has a larger width in the first direction D1.

Figure 3C:
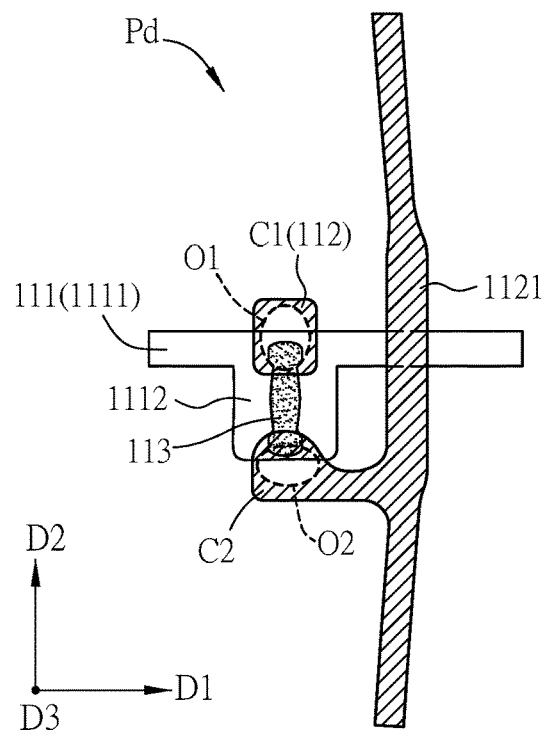

Referring to FIG. 3C, compared with the pixel structure Pb in FIG. 3A, in the pixel structure Pd, the oxide semiconductor layer 113 is fully located in the projecting region of the first conductive layer 111 in the third direction D3.

Figure 3D:
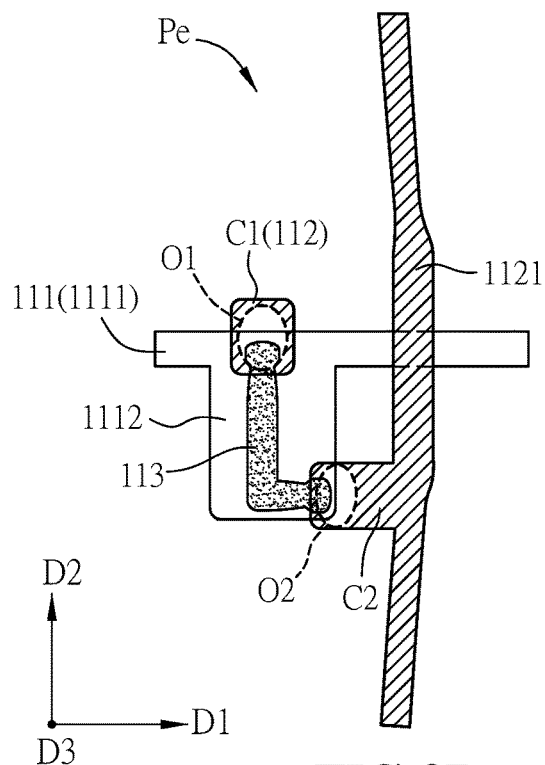

Referring to FIG. 3D, compared with the pixel structure Pd, the protrusive portion 1112 of the first conductive layer 111 has a wider width along the first direction D1, and the shape of the oxide semiconductor layer 113 is like "L" in the pixel structure Pe.

Figure 3E:
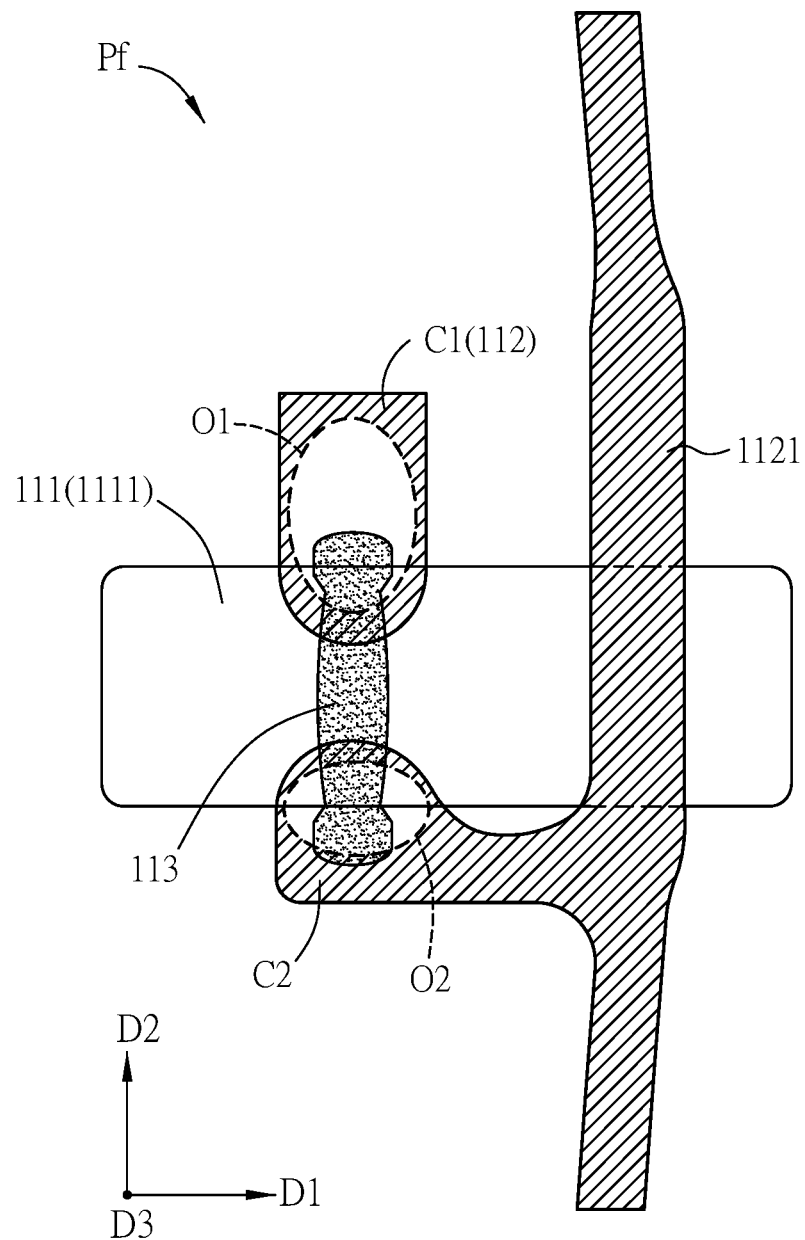

Besides, referring to FIG. 3E, the difference between the pixel structure Pf and the pixel structure P in FIG. 1D is that the pixel structure Pf only has the trace portion 1111 but has no protrusive portion 1112, and the width of the trace portion 1111 along the second direction D2 is wider than the trace portion 1111 of the pixel structure P.

Because other features of the pixel structure Pb~Pf are similar to the corresponding elements of the pixel structure P, the description about other features of the pixel structure Pb~Pf are omitted here.

As mentioned above, as to the display device, the second conductive layer of the pixel structure includes two contact portions which are respectively and correspondingly disposed on the first side and the second side of the trace portion of the first conductive layer, the oxide semiconductor layer is disposed between the first conductive layer and the second conductive layer and the two ends of the oxide semiconductor layer respectively contact the two contact portions. Moreover, the first width of the oxide semiconductor layer along the first direction is narrower than the maximum width (the second width) of the overlap region of one of the contact portions and the first conductive layer along the first direction. Therefore, the size of the pixel structure is smaller and suitable for high resolution product, and the electrical performance of the pixel structure will be better and the display device will have higher display quality.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:
1. A display device, comprising:
   a substrate;
   a first conductive layer, disposed on the substrate and having a trace portion extending along a first direction, wherein the trace portion has a first side and a second side opposite the first side, and the first conductive layer further comprises a protrusive portion extending from the second side of the trace portion to protrude;
   a second conductive layer, disposed on the first conductive layer and having two contact portions, wherein one of the two contact portions overlaps the trace portion, and the other one of the two contact portions overlaps the protrusive portion; and
   an oxide semiconductor layer, disposed between the first conductive layer and the second conductive layer, wherein two parts of the oxide semiconductor layer contact the two contact portions respectively;
   a second insulating layer, disposed on the second conductive layer and having a through hole;
   an electrode, disposed on the second insulating layer and electrically connected to the one of the two contact portions through the through hole; and
   a shading bar, disposed on the substrate, wherein the shading bar is made of a conductive material and is not overlapped with the trace portion, and the through hole is correspondingly located between the shading bar and the trace portion when viewed in a direction normal to the substrate;
   an opposite substrate; and
   a display medium layer, disposed between the substrate and the opposite substrate.
2. The display device of claim 1, wherein the oxide semiconductor layer comprises two end portions and a connection portion located between the two end portions, the width of the connection portion along the first direction is narrower than the width of one of the end portions along the first direction.

3. The display device of claim 2, wherein the two end portions overlap the two contact portions respectively.

4. The display device of claim 1, further comprising a first insulating layer disposed between the oxide semiconductor layer and the second conductive layer, the first insulating layer has two openings corresponding to the two contact portions, and the two contact portions contact the oxide semiconductor layer through the two openings, respectively.

5. The display device of claim 4, wherein one of the openings exposes one terminal edge of the oxide semiconductor layer.

6. The display device of claim 5, wherein the first insulating layer covers the other terminal edge of the oxide semiconductor layer.

7. The display device of claim 1, wherein the second conductive layer further comprises a wiring portion extending along a second direction, the wiring portion is connected to the other one of the two contact portions, and the first direction is cross to the second direction.

* * * * *